(12) United States Patent
Komoto et al.

(10) Patent No.: US 8,134,379 B2
(45) Date of Patent: Mar. 13, 2012

(54) PROBE WAFER, PROBE DEVICE, AND TESTING SYSTEM

(75) Inventors: Yoshio Komoto, Gunma (JP); Yoshiharu Umemura, Kanagawa (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/857,478

(22) Filed: Aug. 16, 2010

(65) Prior Publication Data

US 2011/0109337 A1 May 12, 2011

Related U.S. Application Data

(63) Continuation of application No. PCT/JP2008/055790, filed on Mar. 26, 2008.

(51) Int. Cl.
*G01R 31/00* (2006.01)
(52) U.S. Cl. ......... 324/756.01; 324/762.05; 324/754.07; 324/756.03
(58) Field of Classification Search .. 324/754.01–754.1, 324/754.18, 756.01–756.07, 762.01–762.05
See application file for complete search history.

(56) References Cited

U.S. PATENT DOCUMENTS

| | | | |
|---|---|---|---|
| 6,229,329 B1 * | 5/2001 | Nakata et al. | ............ 324/754.07 |
| 6,420,884 B1 | 7/2002 | Khoury et al. | |
| 2002/0075021 A1 | 6/2002 | Aldaz et al. | |
| 2002/0089342 A1 | 7/2002 | Khoury et al. | |
| 2002/0089343 A1 | 7/2002 | Khoury et al. | |
| 2003/0030455 A1 | 2/2003 | Tanioka et al. | |
| 2005/0209801 A1 | 9/2005 | Hashimoto | |
| 2005/0225336 A1 | 10/2005 | Kojima | |
| 2006/0082358 A1 | 4/2006 | Conner | |
| 2008/0010824 A1 | 1/2008 | Kojima | |
| 2008/0048689 A1 * | 2/2008 | Lee | ............................ 324/754 |

FOREIGN PATENT DOCUMENTS

| | | |
|---|---|---|
| CN | 101065681 A | 10/2007 |
| JP | 2000-249722 A | 9/2000 |
| JP | 2001-21587 A | 1/2001 |
| JP | 2002-222839 A | 8/2002 |
| JP | 2004-170314 A | 6/2004 |

(Continued)

OTHER PUBLICATIONS

International Search Report (ISR) issued in PCT/JP2008/055790 (parent application) mailed in Jul. 2008 for Examiner consideration, citing U.S. Patent No. 1. Patent Application Publication Nos. 1 and 3-5 and Foreign Patent document Nos. 3-6 listed above.

(Continued)

*Primary Examiner* — Arleen M Vazquez
(74) *Attorney, Agent, or Firm* — Chen Yoshimura LLP

(57) ABSTRACT

A probe wafer electrically connected to a semiconductor wafer on which a plurality of semiconductor chips are formed includes: a wafer substrate for pitch conversion including a wafer connection surface and an apparatus connection surface opposing the wafer connection surface; a plurality of wafer connection terminals formed on the wafer connection surface of the wafer substrate for pitch conversion, at least one wafer connection terminal provided for each of the semiconductor chips and electrically connected to an input/output terminal of the corresponding semiconductor chip; a plurality of apparatus connection terminals formed on the apparatus connection surface of the wafer substrate in one-to-one relation with the plurality of wafer connection terminals at an interval different from an interval of the wafer connection terminals, to be electrically connected to an external apparatus; and a plurality of transfer paths, each electrically connecting a corresponding wafer connection terminal to an apparatus connection terminal.

10 Claims, 11 Drawing Sheets

FOREIGN PATENT DOCUMENTS

| | | |
|---|---|---|
| JP | 2004-288911 A | 10/2004 |
| JP | 2005-079144 A | 3/2005 |
| WO | 03/062837 A1 | 7/2003 |
| WO | 2006/044009 A2 | 4/2006 |

OTHER PUBLICATIONS

Written Opinion (PCT/ISA/237) issued in PCT/JP2008/055790 (parent application) mailed in Jul. 2008.

Korean Office Action dated Aug. 29, 2011, in a counterpart Korean patent application No. 10-2010-7014592, citing Foreign Patent document No. 1 above.

Chinese Office Action dated Sep. 14, 2011, in a counterpart Chinese patent application No. 200880127099.4, citing Foreign Patent document No. 1 above and US2008/0048689 and US6229329 which have been cited by examiner (PTO-892).

* cited by examiner

PROBE WAFER, PROBE DEVICE, AND TESTING SYSTEM

BACKGROUND

1. Technical Field

The present invention relates to a probe wafer, a probe apparatus, and a test system.

2. Related Art

In a test of a semiconductor chip, an apparatus for testing acceptability of each of semiconductor chips in the state that they are formed on a semiconductor wafer is known (e.g., by Patent Document No. 1). Such an apparatus may be equipped with a probe card that can be collectively electrically connected to a plurality of semiconductor chips.

The probe card is provided between a test substrate of a test apparatus and a semiconductor wafer. Here, when the interval between the terminals of the test substrate is different from the interval between the terminals of the semiconductor wafer, the probe card should have a certain mechanism for absorbing the difference. One exemplary mechanism is to cause the interval between terminals on the front surface of the probe card to differ from the interval between terminals on the rear surface. By adopting such a mechanism, the terminals on the front surface can be connected to the corresponding terminals on the rear surface in the probe card. Patent Document No. 1: Japanese Patent Application Publication No. 2002-222839
Patent Document No. 2: WO 2003/062837

A general probe card is formed using a print substrate or the like (e.g., see Patent Document No. 2). By forming a plurality of probe pins on the print substrate, the probe card can be collectively electrically connected to a plurality of semiconductor chips.

However, a semiconductor wafer has a different thermal expansion coefficient than that of a print substrate. Therefore, when the temperature fluctuates in such occasions as when the heat is generated by semiconductor chips during a test, and in a heat test or in a cooling test of the semiconductor chips, there sometimes happens that the electrically connection between the semiconductor chip and the probe card is removed. Such a problem will be more noticeable when a test involves semiconductor chips formed on a semiconductor wafer having a large area.

SUMMARY

Therefore, it is an object of an aspect of the innovations herein to provide a probe wafer, a probe apparatus, and a test system, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary probe wafer is a probe wafer electrically connected to a semiconductor wafer on which a plurality of semiconductor chips are formed, the probe wafer including: a wafer substrate for pitch conversion that includes a wafer connection surface and an apparatus connection surface opposing the wafer connection surface; a plurality of wafer connection terminals formed on the wafer connection surface of the wafer substrate for pitch conversion, at least one wafer connection terminal being provided for each of the semiconductor chips and electrically connected to an input/output terminal of the corresponding semiconductor chip; a plurality of apparatus connection terminals formed on the apparatus connection surface of the wafer substrate in one-to-one relation with the plurality of wafer connection terminals at an interval different from an interval of the wafer connection terminals, to be electrically connected to an external apparatus; and a plurality of transfer paths, each of which electrically connects a corresponding wafer connection terminal to an apparatus connection terminal.

According to an aspect related to the innovations herein, one exemplary probe apparatus is a probe apparatus electrically connected to a semiconductor wafer on which a plurality of semiconductor chips are formed, the probe apparatus including: a probe wafer for pitch conversion that is electrically connected to the semiconductor wafer; and a probe wafer for circuit formation that is electrically connected to the probe wafer for pitch conversion, where the probe wafer for pitch conversion includes: a wafer substrate for pitch conversion, a plurality of wafer connection terminals formed on a surface of the wafer substrate for pitch conversion that opposes the semiconductor wafer, at least one wafer connection terminal being provided for each one of the semiconductor chips and electrically connected to an input/output terminal of the corresponding semiconductor chip; a plurality of first intermediate connection terminals formed on a surface of the wafer substrate for pitch conversion that opposes the probe wafer for circuit formation in one-to-one relation with the plurality of wafer connection terminals at an interval different from an interval of the wafer connection terminals, to be electrically connected to the probe wafer for circuit formation; and a plurality of transfer paths, each of which electrically connects a corresponding wafer connection terminal to a first intermediate connection terminal, and the probe wafer for circuit formation includes: a wafer substrate for circuit formation provided to oppose a surface of the wafer substrate for pitch conversion on which the plurality of intermediate connection terminals are provided; a plurality of second intermediate connection terminals provided on the wafer substrate for circuit formation in one-to-one relation with the plurality of first intermediate connection terminals, each second intermediate connection terminal electrically connected to a corresponding one of the first intermediate connection terminals; and a plurality of circuit sections provided so that at least one circuit section is provided for each one of the semiconductor chips, generates a signal to the corresponding semiconductor chip, and supplies a signal to the corresponding semiconductor chip via the intermediate connection terminals and the wafer connection terminal.

According to an aspect related to the innovations herein, one exemplary test system is a test system for testing a plurality of semiconductor chips formed on a semiconductor wafer, the test system including: a signal generating section that outputs a test signal supplied to each of the semiconductor chips; a probe wafer that supplies the test signal received from the signal generating section, to each of the semiconductor chips; and a judging section that receives, via the probe wafer, a response signal outputted from each of the semiconductor chips in response to the test signal, and judges acceptability of each of the semiconductor chips based on the response signal, where the probe wafer includes: a wafer substrate for pitch conversion that includes a wafer connection surface and an apparatus connection surface opposing the wafer connection surface; a plurality of wafer connection terminals formed on the wafer connection surface of the wafer substrate for pitch conversion, at least one wafer connection terminal being provided for each of the semiconductor chips and electrically connected to an input/output terminal of the corresponding semiconductor chip; a plurality of apparatus connection terminals formed on the apparatus connection surface of the wafer substrate in one-to-one relation with the plurality of wafer connection terminals at an interval different from an interval of the wafer connection terminals, to be electrically connected to the signal generating section; and a plurality of transfer paths, each of which electrically connects a corresponding wafer connection terminal to an apparatus connection terminal.

According to an aspect related to the innovations herein, one exemplary test system is a test system for testing a plurality of semiconductor chips formed on a semiconductor wafer, the test system including: a signal generating section that outputs a test signal supplied to each of the semiconductor chips; a probe apparatus that supplies the test signal received from the signal generating section, to each of the semiconductor chips; and a judging section that receives, via the probe apparatus, a response signal outputted from each of the semiconductor chips in response to the test signal, and judges acceptability of each of the semiconductor chips based on the response signal, where the probe apparatus includes: a probe wafer for pitch conversion electrically connected to the semiconductor wafer; and a probe wafer for circuit formation electrically connected to the probe wafer for pitch conversion, the probe wafer for pitch conversion includes: a wafer substrate for pitch conversion, a plurality of wafer connection terminals formed on a surface of the wafer substrate for pitch conversion that opposes the semiconductor wafer, at least one wafer connection terminal being provided for each one of the semiconductor chips and electrically connected to an input/output terminal of the corresponding semiconductor chip; a plurality of first intermediate connection terminals formed on a surface of the wafer substrate for pitch conversion that opposes the probe wafer for circuit formation in one-to-one relation with the plurality of wafer connection terminals at an interval different from an interval of the wafer connection terminals, to be electrically connected to the probe wafer for circuit formation; and a plurality of transfer paths, each of which electrically connects a corresponding wafer connection terminal to a first intermediate connection terminal, and the probe wafer for circuit formation includes: a wafer substrate for circuit formation provided to oppose a surface of the wafer substrate for pitch conversion on which the plurality of intermediate connection terminals are provided; a plurality of second intermediate connection terminals provided on the wafer substrate for circuit formation in one-to-one relation with the plurality of first intermediate connection terminals, each second intermediate connection terminal electrically connected to a corresponding one of the first intermediate connection terminals; and a plurality of circuit sections provided so that at least one circuit section is provided for each one of the semiconductor chips and tests the corresponding semiconductor chip via the intermediate connection terminals and the wafer connection terminal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
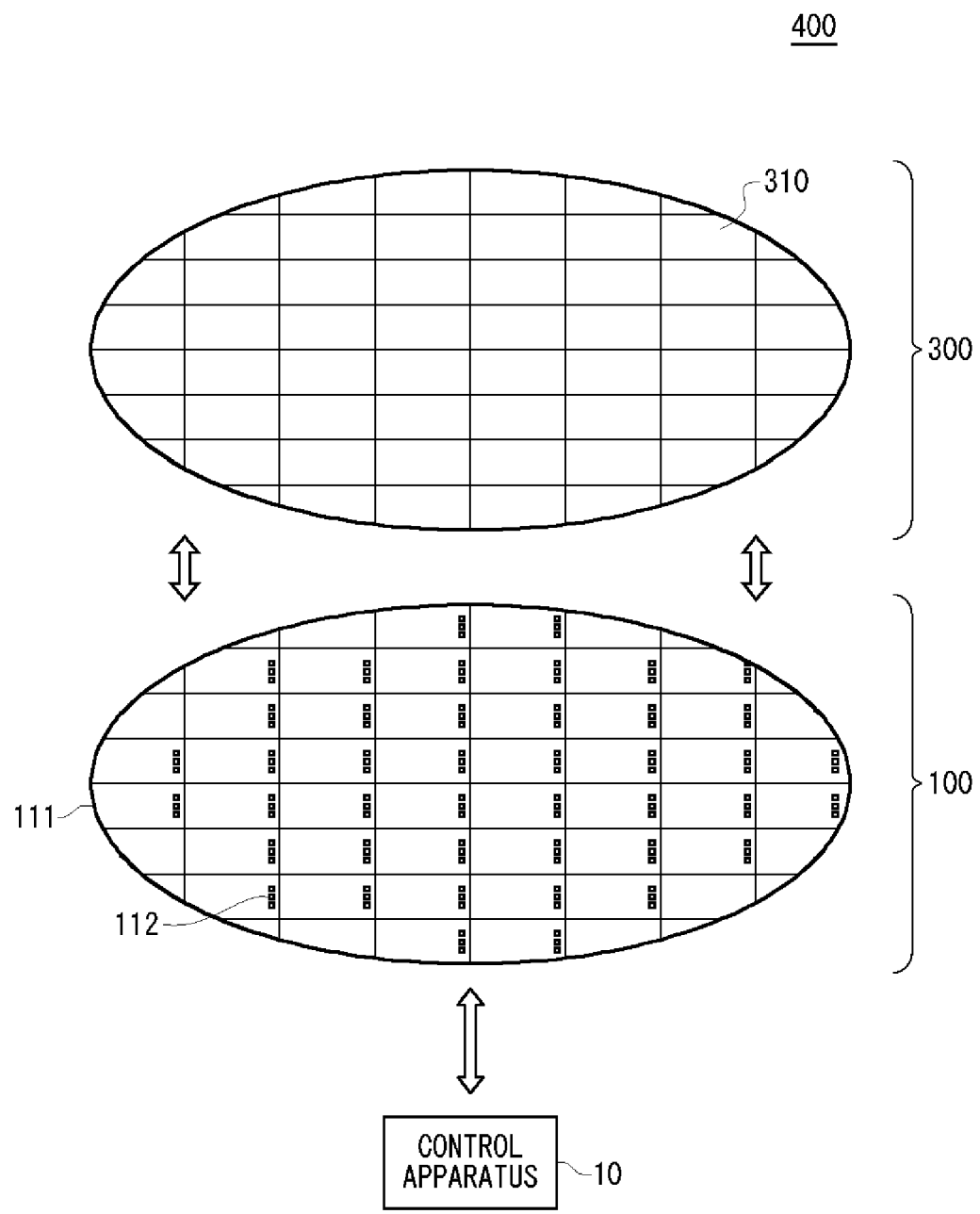
FIG. 1 shows an exemplary configuration of a test system 400 according to an embodiment.

FIG. 1 shows an exemplary configuration of a test system 400 according to an embodiment. The test system 400 tests a plurality of semiconductor chips 310 formed on a semiconductor wafer 300 under test, and includes a probe wafer 100 and a control apparatus 10. Note that FIG. 1 shows an exemplary perspective view of the semiconductor wafer 300 and the probe wafer 100.

The semiconductor wafer 300 may be a disk-shaped semiconductor substrate. More specifically, the semiconductor wafer 300 may be a substrate made of silicon, compound semiconductor, or other semiconductors. In addition, the semiconductor chip 310 may be formed on the semiconductor wafer 300 using a semiconductor process such as exposure.

The probe wafer 100 electrically connects the semiconductor wafer 300 to the control apparatus 10. More specifically, the probe wafer 100 is provided between each terminal of the control apparatus 10 and each terminal formed on the semiconductor wafer 300, and electrically connects corresponding terminals respectively formed on the control apparatus 10 and the semiconductor wafer 300. As detailed later with reference to FIG. 2, the probe wafer 100 in the present example includes a wafer substrate 111 for pitch conversion and a plurality of wafer connection terminals 112.

The control apparatus 10 tests each semiconductor chip 310 on the semiconductor wafer 300 via the probe wafer 100. For example, the control apparatus 10 may supply a test signal to each semiconductor chip 310 via the probe wafer 100. In addition, the control apparatus 10 may receive via the probe wafer 100 a response signal outputted by each semiconductor chip 310 in response to the test signal and judge the acceptability of each semiconductor chip 310 according to the response signal.

Figure 2:
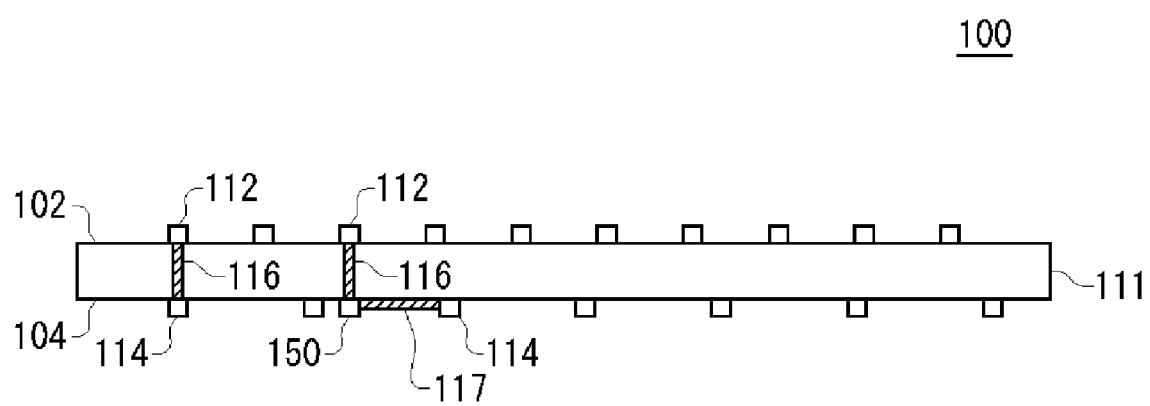
FIG. 2 shows an exemplary side view of a probe wafer 100.

FIG. 2 shows an exemplary side view of a probe wafer 100. As shown in FIG. 1 and FIG. 2, the probe wafer 100 includes a wafer substrate 111 for pitch conversion, wafer connection terminals 112, apparatus connection terminals 114, through holes 116, pads 150, and wirings 117.

The wafer substrate 111 for pitch conversion is made of the same semiconductor material as that of the substrate of the semiconductor wafer 300. For example, the wafer substrate 111 for pitch conversion may be a silicon substrate. In addition, the wafer substrate 111 for pitch conversion may be made of a semiconductor material having substantially the same thermal expansion coefficient as that of the substrate of the semiconductor wafer 300. Moreover, the wafer substrate 111 for pitch conversion includes a wafer connection surface 102 and an apparatus connection surface 104 opposing the wafer connection surface 102, as shown in FIG. 2. The wafer connection surface 102 opposes the semiconductor wafer 300 of FIG. 1, and the apparatus connection surface 104 opposes the control apparatus 10 of FIG. 1.

In addition, the wafer substrate 111 for pitch conversion has a surface on which the semiconductor chips 310 of the semiconductor wafer 300 are formed, and a wafer connection surface shaped in substantially the same shape. The wafer connection surface may have a round shape having substantially the same diameter as that of the surface of the semiconductor wafer. The wafer substrate 111 for pitch conversion is placed to oppose the semiconductor wafer 300. In addition, the wafer substrate 111 for pitch conversion may be a semiconductor substrate having a disk shape having a diameter larger than that of the semiconductor wafer 300.

The plurality of wafer connection terminals 112 are formed on the wafer connection surface 102 of the wafer substrate 111 for pitch conversion. The wafer connection terminals 112 are provided so that at least one wafer connection terminal 112 is provided for each semiconductor chip 310. For example, at least one wafer connection terminal 112 may be provided to each input/output terminal of each semiconductor chip 310. In other words, when each semiconductor chip 310 has a plurality of input/output terminals, a plurality of wafer connection terminals 112 may be provided for each one of the semiconductor chips 310.

Each wafer connection terminal 112 is provided at the same interval as the interval at which each input/output terminal is provided in the semiconductor wafer 300, and is electrically connected to the corresponding input/output terminal of the semiconductor chip 310. Note that "electrical connection" used here means a state in which two members can exchange signals. For example, the input/output terminals respectively of the wafer connection terminal 112 and the semiconductor chip 310 may be electrically connected to each other, either by direct contact with each other, or by indirect contact via a different conductor. In addition, the input/output terminals respectively of the wafer connection terminal 112 and the semiconductor chip 310 may be electrically connected to each other in non-contact state such as by capacity coupling (electrostatic coupling) or inductive coupling (magnetic coupling). Moreover, a part the transfer path between the input/output terminals of the wafer connection terminal 112 and the semiconductor chip 310 may be an optical transfer path.

The plurality of apparatus connection terminals 114 are formed on the apparatus connection surface 104 of the wafer substrate 111 for pitch conversion, and are electrically connected to the control apparatus 10. In addition, the apparatus connection terminals 114 are provided in one-to-one relation with the plurality of wafer connection terminals 112. Here, the apparatus connection terminals 114 are provided at the same interval as that of the terminals of the control apparatus 10. Therefore, the apparatus connection terminals 114 may be provided at an interval different from that of the wafer connection terminals 112 as shown in FIG. 2.

The through holes 116, the pads 150, and the wirings 117 are formed on the wafer substrate 111 for pitch conversion, to electrically connect each wafer connection terminal 112 to a corresponding apparatus connection terminal 114. For example, the pads 150 are provided on the apparatus connection surface 104, in a position opposing the wafer connection terminals 112. The through holes 116 may be formed through the wafer substrate 111 for pitch conversion so that an end of a through hole 116 is connected to a wafer connection terminal 112, and the other end is connected to a pad 150. Moreover, a wiring 117 electrically connects a pad 150 and an apparatus connection terminal 114 on the apparatus connection surface 104. By adopting such a configuration, the apparatus connection terminals 114 and the wafer connection terminals 112 aligned at different intervals from each other can be electrically connected to each other.

For example, a wafer connection terminal 112 is provided at the same interval as that of each input terminal of a semiconductor chip 310 so as to be electrically connected to it. Therefore, the wafer connection terminals 112 may be provided at a small interval on a region predetermined for each semiconductor chip 310, as shown in FIG. 1 for example.

As opposed to this, the apparatus connection terminals 114 may be provided at a larger interval than the interval of the corresponding wafer connection terminals 112 on a semiconductor chip 310. For example, the apparatus connection terminals 114 may be provided at a constant interval so that their distribution is substantially even on the surface of the apparatus connection surface 104.

In the probe wafer 100 of the present example, the wafer substrate 111 for pitch conversion is made of the same semiconductor material as that of the substrate of the semiconductor wafer 300, and so even when the ambient temperature fluctuates for example, the electrical connection between the probe wafer 100 and the semiconductor wafer 300 can be favorably maintained. Therefore, even in such a test as involving heating of a semiconductor wafer 300, the semiconductor wafer 300 can be tested with accuracy.

In addition, the wafer substrate 111 for pitch conversion is made of a semiconductor material, a plurality of wafer connection terminals 112 or the like can be easily formed on the wafer substrate 111 for pitch conversion. For example, a semiconductor process using exposure or the like can be used to easily form the wafer connection terminals 112, the apparatus connection terminals 114, the through holes 116, and the wirings 117. This enables to easily form a plurality of wafer connection terminals 112 or the like corresponding to the plurality of semiconductor chips 310 on the wafer substrate 111 for pitch conversion. In addition, the terminals of the probe wafer 100 may be formed on the wafer substrate 111 for pitch conversion by a technique such as plating or evaporation of conductive materials.

Note that this example uses the probe wafer 100 in the test system 400, however the present invention is not limited to such examples. For example, when the plurality of semiconductor chips 310 in the state formed in a semiconductor wafer 300 are used in an electric appliance, the probe wafer 100 may be electrically connected to the semiconductor wafer 300, in a state mounted to the electric appliance or the like.

Figure 3:
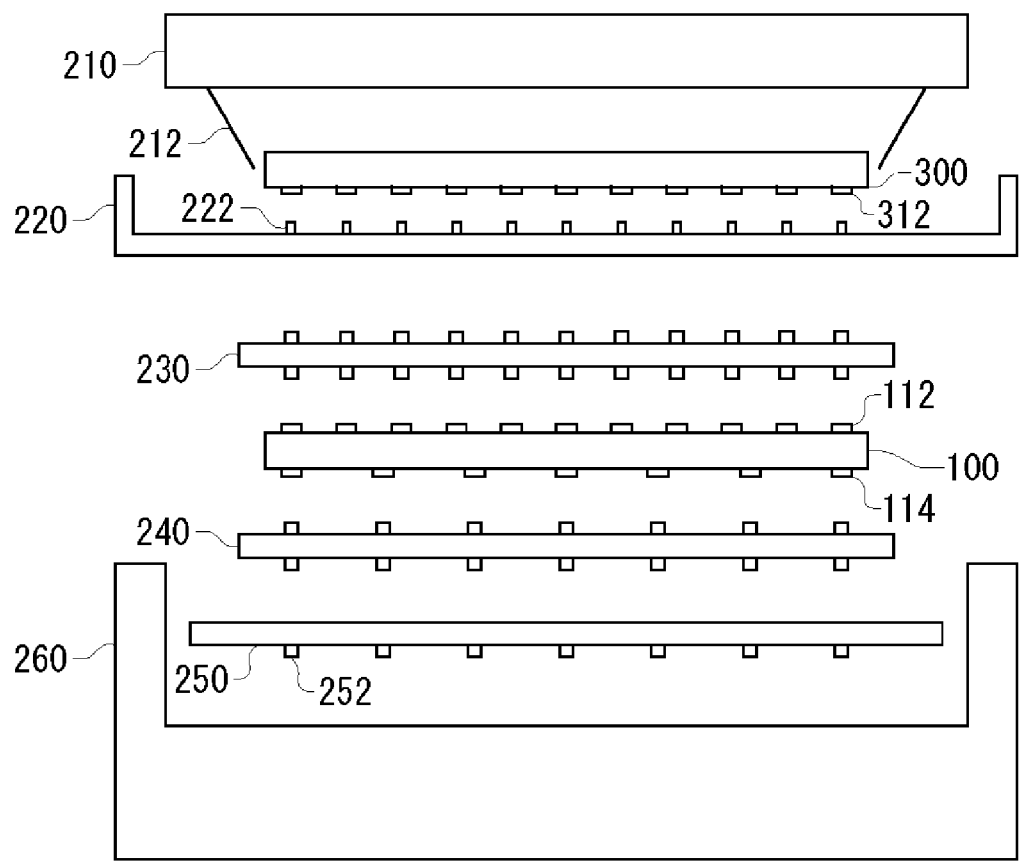
FIG. 3 is a sectional view showing an exemplary configuration of a probe apparatus 200 including a probe wafer 100.

FIG. 3 is a sectional view showing an exemplary configuration of a probe apparatus 200 including a probe wafer 100. In the present example, each constituting element of the probe apparatus 200 is distanced from each other, each constituting element however is actually provided in contact with the other constituting elements adjacent in the upper and lower directions of FIG. 3. The probe apparatus 200 retains the semiconductor wafer 300, to electrically connect the probe wafer 100 to the semiconductor wafer 300.

The probe apparatus 200 includes a wafer tray 210, a wafer membrane 220, a wafer PCR 230, a probe wafer 100, an apparatus PCR 240, an apparatus membrane 250, and an apparatus substrate 260. The wafer tray 210 retains the semiconductor wafer 300. For example, the wafer tray 210 opposes a surface of the semiconductor wafer 300 on which terminals 312 are not formed. In addition, the wafer tray 210 may include a retaining member 212 for retaining the semiconductor wafer 300.

The retaining member 212 may be an engaging member for engaging the semiconductor wafer 300 to the wafer tray 210. Moreover, the retaining member 212 may adsorb the semiconductor wafer 300 to the wafer tray 210. In this case, a through hole is provided through the wafer tray 210, via which the retaining member 212 adsorbs the semiconductor wafer 300 to the wafer tray 210.

The wafer membrane 220 is provided between the semiconductor wafer 300 and the wafer PCR 230, to electrically connect the semiconductor wafer 300 and the wafer PCR 230. A plurality of conductive bumps 222, penetrating the front surface to the rear surface of a sheet made of an insulator, are provided on the wafer membrane 220. The bumps 222 are electrically connected to the terminals of the semiconductor chips 310 on the semiconductor wafer 300. The bumps 222 may be provided in the same placement as that of the wafer connection terminals 112 of the probe wafer 100.

The wafer PCR 230 is provided between the wafer membrane 220 and the probe wafer 100, to electrically connect the bumps 222 of the wafer membrane 220 to the wafer connection terminals 112 of the probe wafer 100. The wafer PCR 230 may be a sheet made of an anisotropic conductive film that is pressed by the bumps 222 and the wafer connection terminals 112, to electrically connect the bumps 222 and the wafer connection terminals 112.

The apparatus PCR 240 is provided between the probe wafer 100 and the apparatus membrane 250, to electrically connect the apparatus connection terminals 114 of the probe wafer 100 to the bumps 252 of the apparatus membrane 250. The apparatus PCR 240 may be a sheet made of an anisotropic conductive film that is pressed by the apparatus connection terminals 114 and he bumps 252, to electrically connect the apparatus connection terminals 114 and the bumps 252.

The apparatus membrane 250 is provided between the apparatus PCR 240 and the apparatus substrate 260, to electrically connect the apparatus PCR 240 and the apparatus substrate 260. A plurality of conductive bumps 252, penetrating the front surface to the rear surface of a sheet made of an insulator, are provided on the apparatus membrane 250. The bumps 252 are electrically connected to the terminals of the apparatus substrate 260. The bumps 252 may be provided in the same placement as that of the apparatus connection terminals 114 of the probe wafer 100.

The apparatus substrate 260 is fixed to the configuration from the wafer tray 210 up to the apparatus membrane 250. For example, the fixing of the configuration from the wafer tray 210 up to the apparatus substrate 260 may be performed by means of screw or vacuum contact, for example. In addition, the apparatus substrate 260 electrically connects the control apparatus 10 and each bump 252 of the apparatus membrane 250. The apparatus substrate 260 may be a print substrate.

Note that each membrane becomes effective in such cases as when an area of a terminal (pad) electrically connected via the membrane is small, or when the terminal is made of an aluminum film or the like and an oxidation film is formed on its surface. When the area of the terminal electrically connected to via the membrane is sufficiently large, for example, the membrane may not be provided. Since the terminal of the apparatus substrate 260 can be easily made large and made by gold plating and so on, the probe apparatus 200 may not be provided with any apparatus membrane 250.

According to such a configuration, the probe wafer 100 can be electrically connected to the semiconductor wafer 300. Likewise, the probe wafer 100 and the control apparatus 10 may be electrically connected to each other. Note that it is desirable to make the wafer membrane 220 of a material having the same level of thermal expansion coefficient as that of the substrate of the semiconductor wafer 300. In addition, it is desirable to make the apparatus membrane 250 of a material having the same level of thermal expansion coefficient as that of the wafer substrate 111 for pitch conversion.

Figure 4:
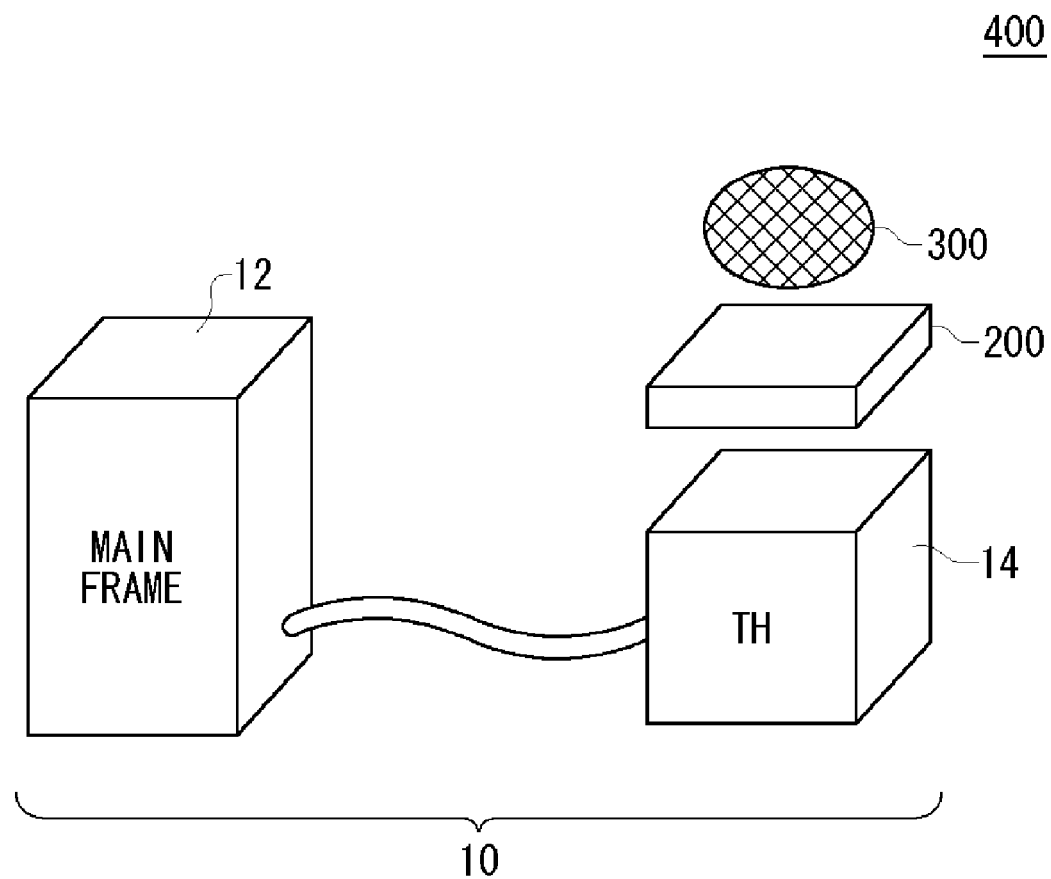
FIG. 4 is a conceptual diagram of an exemplary configuration of a control apparatus 10.

FIG. 4 is a conceptual diagram of an exemplary configuration of a control apparatus 10. The control apparatus 10 includes a main frame 12 and a test head 14. The main frame 12 controls the test head 14, to test each semiconductor chip 310 of the semiconductor wafer 300. The test head 14 generates a test signal by being controlled by the main frame 12, and supplies the test signal to each semiconductor chip 310 via the probe apparatus 200. For example, the test head 14 may supply the same test signal to the semiconductor chips 310.

In addition, the test head 14 receives a response signal from each semiconductor chip 310 via the probe apparatus 200. The test head 14 may judge the acceptability of each semiconductor chip 310 based on a corresponding response signal. The test head 14 may transfer the acceptability judgment result of each semiconductor chip 310 to the main frame 12. The semiconductor chips 310 can be tested according to such a configuration.

Note that the main frame 12 is shown as a different apparatus from the test head 14 in FIG. 4. However, the main frame 12 and the test head 14 may be integrated into a single apparatus. For example, when the control apparatus 10 has scarce test resource, the main frame 12 and the test head 14 can be stored in a single casing.

Figure 5:
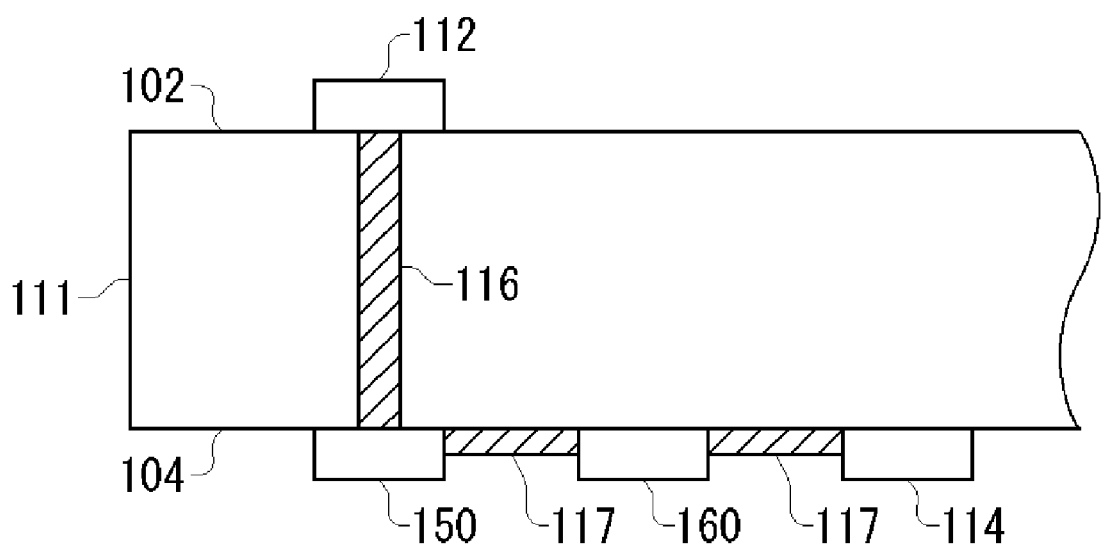
FIG. 5 shows another exemplary side view of the probe wafer 100.

FIG. 5 shows another exemplary side view of the probe wafer 100. The probe wafer 100 in this example includes a switch 160, in addition to the configuration of the probe wafer 100 explained above with reference to FIG. 2.

A switch 160 is formed between a pad 150 and an apparatus connection terminal 114, to switch whether to connect the pad 150 to the apparatus connection terminal 114 via the wiring 117. The switch 160 may switch the connection by means of a transistor formed using a semiconductor process.

The switch 160 may be provided to each of the apparatus connection terminals 114, or may be provided to a part of the apparatus connection terminals 114. According to such a configuration, the electric connection between the control apparatus 10 and the semiconductor chip 310 can be switched for each pin of the semiconductor chip 310.

At least one of the apparatus connection terminals 114 may receive, from the control apparatus 10, power supply to be supplied to the semiconductor chip 310. For example, at least one of the apparatus connection terminals 114 may receive power supply from the control apparatus 10, for each semiconductor chip 310. The wafer connection terminals 112 corresponding to these apparatus connection terminals 114 receive power supply via the through holes 116, to supply power to the corresponding semiconductor chips 310.

Note that the through holes 116 corresponding to the apparatus connection terminals 114 that receive a power supply may be filled with a conductive material different from the other through holes 116 transferring signals. For example, the thorough holes 116 transferring the power supply may not transfer a high frequency signal with accuracy, and so may be filled with a conductive material having a lower high frequency property than that of the other through holes 116. For example, the through holes 116 transferring the power supply may be filled with copper, while the other through holes 116 may be filled with gold.

Figure 6:
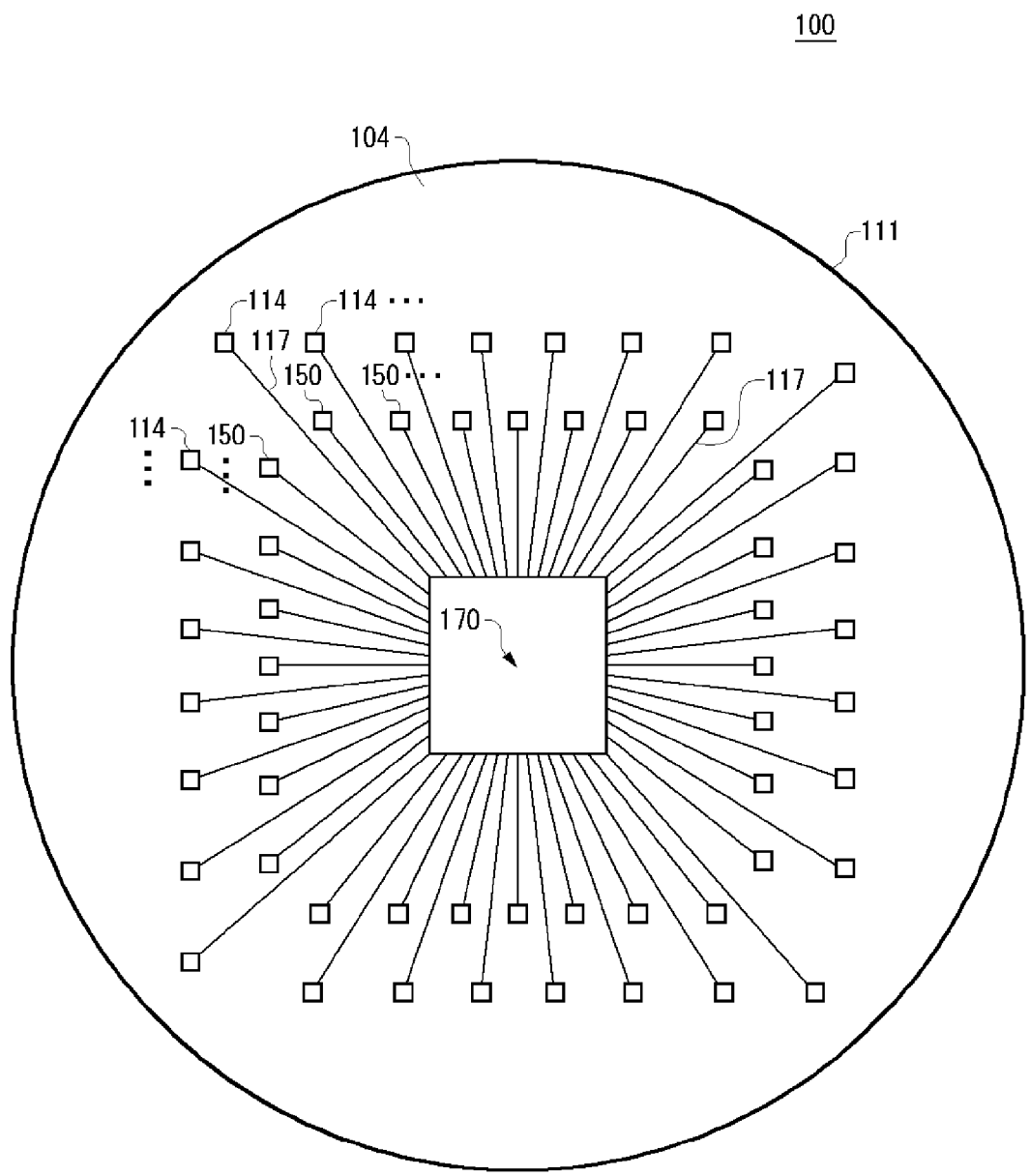
FIG. 6 shows another configuration of the probe wafer 100.

FIG. 6 shows another configuration of the probe wafer 100. FIG. 6 shows an apparatus connection surface 104 of the probe wafer 100. The probe wafer 100 in the present example includes a switch section 170 in addition to the configuration of the probe wafer 100 explained above with reference to FIG. 2.

The switch section 170 switches which of the pads 150 each of the apparatus connection terminals 114 is to be connected to. For example, the switch section 170 connects each of the apparatus connection terminals 114 to a corresponding pad 150 via a wiring 117. The switch section 170 may switch which wiring 117 of which pad 150 the wiring 117 corresponding to each apparatus connection terminal 114 is to be electrically connected. For example, the switch section 170 may switch the connection of these wirings 117 using a plurality of transistors.

FIG. 6 shows an example in which a single switch section 170 controls connection of all the wirings 117. However in a different example, a plurality of switch sections 170 may be used to control the connection of the wirings 117. For example, the probe wafer 100 may be divided into predetermined regions, so that each switch section 170 controls the connection of the wiring 117 in the corresponding region. The plurality of switch sections 170 may be provided to correspond to a plurality of semiconductor chips 310, such that each switch section 170 controls the connection between the wafer connection terminal 112 corresponding to each semiconductor chip 310 and the apparatus connection terminal 114.

In addition, the pads 150, the wirings 117, and the switch section 170 may be provided on the wafer connection surface 102. In this case, the through holes 116 are provided such that an end of a through hole 116 is connected to an apparatus connection terminal 114, and the other end thereof is connected to a pad 150. In addition, the a wiring 117 connects a corresponding pad 150 and a corresponding wafer connection terminal 112 to the switch section 170. The switch section 170 switches which wafer connection terminal 112 each pad 150 is connected to.

Generally speaking, which slot of the test head 14 the plurality of test modules of the control apparatus 10 connected to the plurality of apparatus connection terminals 114 are to be placed is determined according to the function of the plurality of test modules. For example, the test module that functions as a power supply module is placed in a slot corresponding to an apparatus connection terminal 114 corresponding to the power supply pin of the semiconductor chip 310, so as to be connected to the apparatus connection terminal 114.

As opposed to this, the probe wafer 100 according to the present example can change the connection between the plurality of apparatus connection terminals 114 and the plurality of wafer connection terminals 112. Therefore, any test module provided in an arbitrary slot can be connected to a predetermined terminal 312 of a semiconductor chip 310 by changing the setting in the switch section 170. In other words, the test system 400 in the present example can enhance the degree of freedom of the design of the test head 14.

Figure 7:
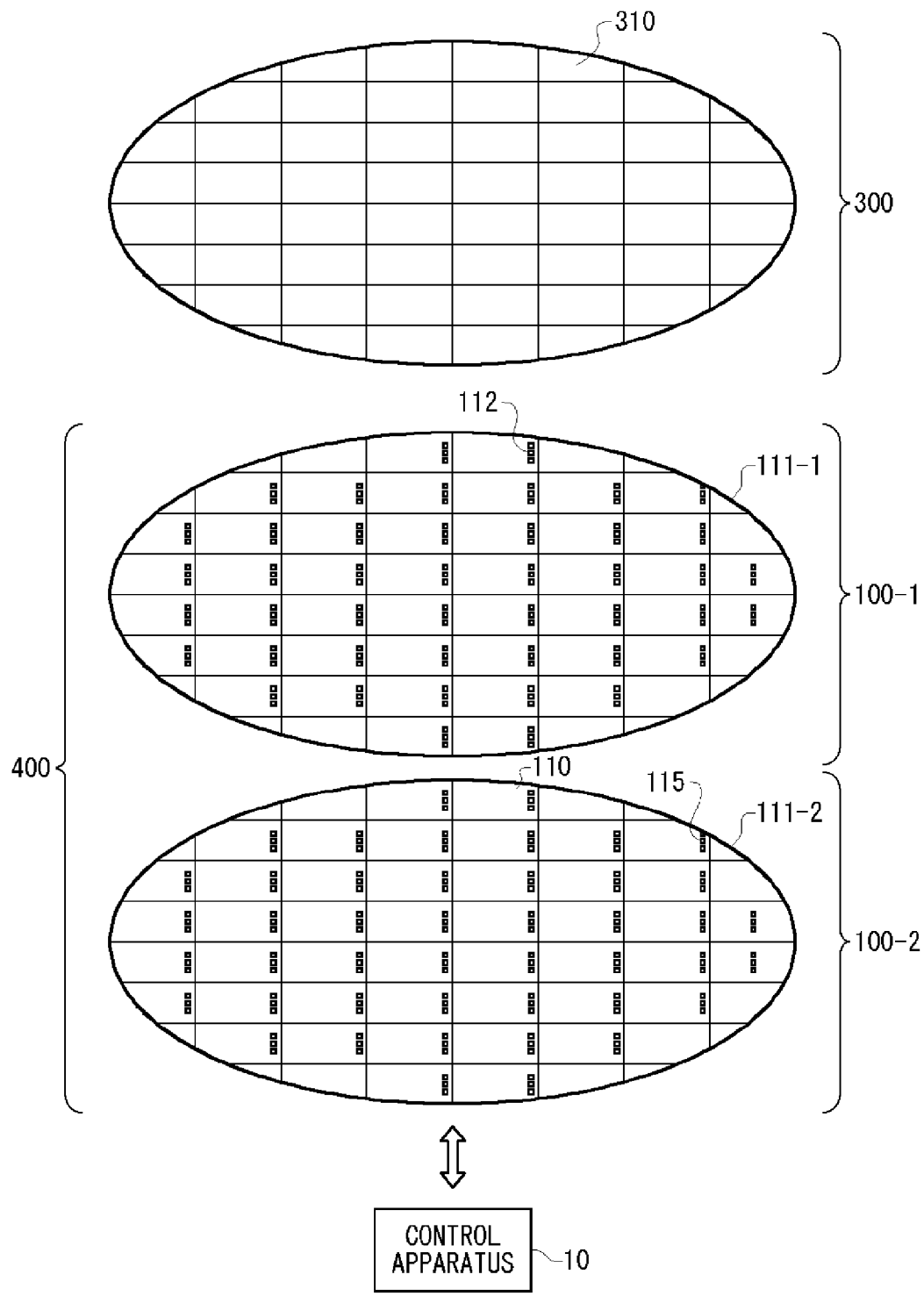
FIG. 7 shows another exemplary configuration of the test system 400.

FIG. 7 shows another exemplary configuration of the test system 400. The test system 400 in the present example includes a probe wafer 100-1 for pitch conversion, a probe wafer 100-2 for circuit formation, and a control apparatus 10. The probe wafer 100-1 is provided between the semiconductor wafer 300 and the probe wafer 100-2. The probe wafer 100-2 is provided between the probe wafer 100-1 and the control apparatus 10. The probe wafer 100-1 and the probe wafer 100-2 may respectively have a surface formed in a round shape having substantially the same diameter as the diameter of the surface of the semiconductor wafer 300 on which the semiconductor chips 310 are formed.

The probe wafer 100-1 may have the same function and configuration as that of the probe wafer 100 explained above with reference to FIG. 1 through FIG. 6, except that the apparatus connection surface 104 of the probe wafer 100-1 is provided with a plurality of first intermediate connection terminals, instead of the plurality of apparatus connection terminals 114, so as to be electrically connected to the probe wafer 100-2 via the first intermediate connection terminals. The structure of the first intermediate connection terminals may be the same as the structure of the apparatus connection terminals 114.

The probe wafer 100-2 includes a wafer substrate 111-2 for circuit formation, a plurality of circuit sections 110, a plurality of second intermediate connection terminals 115, and a plurality of apparatus connection terminals. The wafer substrate 111-2 may be made of the same material as that of the substrate 111-1 for pitch conversion of the probe wafer 100-1.

A plurality of second intermediate connection terminals 115 are formed on a surface of the wafer substrate 111-2 opposing the probe wafer 100-1. The plurality of second intermediate connection terminals 115 are provided in one-to-one relation with the plurality of first intermediate connection terminals of the probe wafer 100-1, and are electrically connected to the corresponding first intermediate connection terminals. The probe wafer 100-2 exchanges signals with the probe wafer 100-1 via the second intermediate connection terminals 115.

The plurality of apparatus connection terminals are electrically connected to the control apparatus 10, just as the apparatus connection terminals 114 explained above with reference to FIG. 1 through FIG. 6. Each apparatus connection terminal is electrically connected to a corresponding one of the second intermediate connection terminals 115, via a through hole or the like.

The circuit sections 110 are provided such that at least one circuit section 110 is provided for each semiconductor chip 310. Each circuit section 110 is formed on a wafer substrate 111-2, and exchanges signals with a corresponding semiconductor chip 310 via a second intermediate connection terminal 115 and the probe wafer 100-1. Each circuit section 110 exchanges signals with the control apparatus 10 via an apparatus connection terminal.

Each circuit section 110 may generate a test signal for testing a corresponding semiconductor chip 310, and supplies the test signal to the semiconductor chip 310. In addition, each circuit section 110 may receive a response signal outputted from the corresponding semiconductor chip 310. Each circuit section 110 may judge the acceptability of the corresponding semiconductor chip 310 by comparing the logical pattern of the corresponding response signal to a predetermined expected value pattern.

Each circuit section 110 may have all or a part of the function of the main frame 12 and the test head 14 shown in FIG. 4. According to the configuration, the size of the control apparatus 10 can be reduced. For example, it is sufficient that the control apparatus 10 may include the function of notifying the circuit section 110 of the timing of test start or the like, the function of reading the test result in the circuit section 110, and the function of supplying a driving power of the circuit section 110 and the semiconductor chip 310.

Since the wafer substrate 111-2 is made of a semiconductor material, a high density circuit section 110 can be easily formed in the wafer substrate 111-2. For example, a semiconductor process using exposure or the like can be used to easily form a high density circuit section 110 in the wafer substrate 111. This enables to easily form a plurality of circuit sections 110 corresponding to the plurality of semiconductor chips 310 on the wafer substrate 111.

As explained above, the test system 400 according to the present example can reduce the contact failure between the terminals attributed to the temperature fluctuation and so on. Moreover, the size of the test system 400 can be reduced. In addition, because both of the probe wafer 100-1 for pitch conversion and the probe wafer 100-2 for circuit formation are provided, when for example a semiconductor wafer 300 is tested with the same test content and different terminal intervals, only the probe wafer 100-1 for pitch conversion should be exchanged while keeping to use a common probe wafer 100-2 for circuit formation, which helps reduce the test cost.

Figure 8:
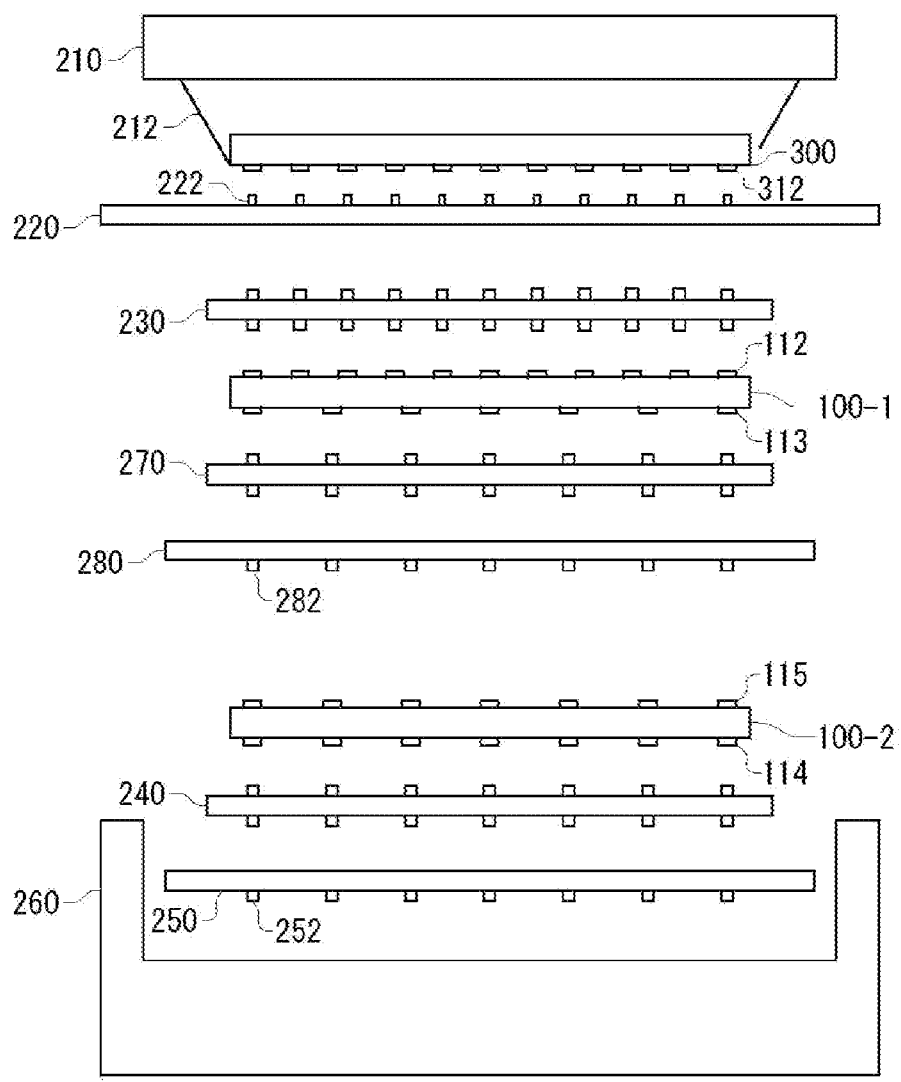
FIG. 8 is a sectional view of an exemplary configuration of a probe apparatus 200 including a probe wafer 100-1 for pitch conversion and a probe wafer 100-2 for circuit formation.

FIG. 8 is a sectional view of an exemplary configuration of a probe apparatus 200 including a probe wafer 100-1 for pitch conversion and a probe wafer 100-2 for circuit formation. In the example of the drawing, each constituting element of the probe apparatus 200 is distanced from each other, each constituting element however is actually provided in contact with the other constituting elements adjacent in the upper and lower directions of FIG. 8.

The probe apparatus 200 includes a wafer tray 210, a wafer membrane 220, a wafer PCR 230, a probe wafer 100, an apparatus PCR 240, an apparatus membrane 250, an intermediate PCR 270, an intermediate membrane 280, and an apparatus substrate 260. The wafer tray 210 retains a semiconductor wafer 300.

The wafer tray 210, the wafer membrane 220, and the wafer PCR 230 may have the same function and structure as that of the wafer tray 210, the wafer membrane 220, and the wafer PCR 230 explained above with reference to FIG. 3. Note that the wafer PCR 230 is provided between the wafer membrane 220 and the probe wafer 100-1, to electrically connect the bumps 222 of the wafer membrane 220 to the wafer connection terminals 112 of the probe wafer 100-1.

Moreover, the probe wafer 100-1 includes a plurality of first intermediate connection terminals 113 on a surface opposing the intermediate PCR 270. Each first intermediate connection terminal 113 may be electrically connected to a corresponding wafer connection terminal 112 via a through hole 116, just as the apparatus connection terminals 114 explained above with reference to FIG. 2. Moreover, the plurality of first intermediate connection terminals 113 are provided in the same placement as that of the later-detailed second intermediate connection terminals 115. In addition, the first intermediate connection terminals 113 may be provided in a different placement from that of the wafer connection terminals 112.

The intermediate PCR 270 is provided between the probe wafer 100-1 and the intermediate membrane 280, to electrically connect the first intermediate connection terminals 113 of the probe wafer 100-1 to the bumps 282 of the intermediate membrane 280. The intermediate PCR 270 may be a sheet made of an anisotropic conductive film that is pressed by the bumps 282 and the first intermediate connection terminals 113, to electrically connect the bumps 282 and the first intermediate connection terminals 113.

The intermediate membrane 280 is provided between the intermediate PCR 270 and the probe wafer 100-2, to electrically connect the intermediate PCR 270 and to the probe wafer 100-2. The intermediate membrane 280 is provided with a plurality of conductive bumps 282 penetrating the front surface to the rear surface of a sheet made of an insulator. The bumps 282 are electrically connected to the second intermediate connection terminals 115 of the probe wafer 100-2. The bumps 282 may be provided in the same placement as that of the second intermediate connection terminals 115 of the probe wafer 100-2.

The probe wafer 100-2 may also have a plurality of second intermediate connection terminals 115 provided on the surface of the wafer substrate 111-2 opposing the intermediate membrane 280 in one-to-one relation with the plurality of first intermediate connection terminals 113. Each second intermediate connection terminal 115 may be electrically connected with a corresponding apparatus connection terminal 114 via a through hole provided through the wafer substrate 111-2. The second intermediate connection terminals 115 may be provided in the same placement as that of the apparatus connection terminals 114.

The apparatus PCR 240, the apparatus membrane 250, and the apparatus substrate 260 may have the same function and structure as that of the apparatus PCR 240, the apparatus membrane 250, and the apparatus substrate 260 explained above with reference to FIG. 3. Note that the apparatus PCR 240 is provided between the apparatus membrane 250 and the probe wafer 100-2, to electrically connect the apparatus membrane 250 and the probe wafer 100-2. According to the stated configuration, the semiconductor wafer 300 can be tested using the two probe wafers 100.

Just as already explained above with reference to FIG. 3, the probe apparatus 200 of the present example may not be provided with any of the membranes either. For example, as in the example explained with reference to FIG. 3, the probe apparatus 200 may not be provided with the apparatus membrane 250. Since the terminal of the probe wafer 100 can also be easily made large and made by gold plating and so on, the probe apparatus 200 may not be provided with any intermediate membrane 280.

Figure 9:
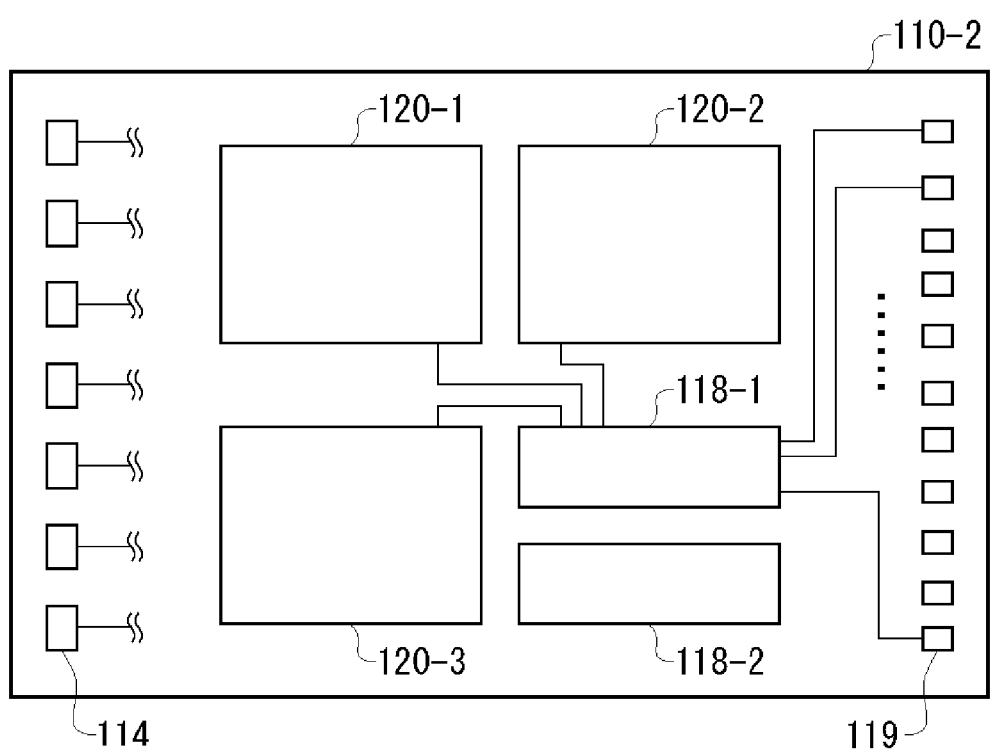
FIG. 9 shows an exemplary configuration of a circuit section 110.

FIG. 9 shows an exemplary configuration of a circuit section 110. This is an example in which circuit sections 110 are provided on a surface of the wafer substrate 111-2 opposing the control apparatus 10. Note that the plurality of circuit sections 110 formed on the wafer substrate 111-2 may have the same configuration as each other.

Each circuit section 110 includes a plurality of test circuits 120 and a plurality of switch sections 118. In addition, a circuit section 110 is provided with a plurality of pads 119. The plurality of pads 119 may be electrically connected via the second intermediate connection terminals 115 and the through holes as explained above with reference to FIG. 7 and FIG. 8.

Each test circuit 120 is connected to the control apparatus 10 via an apparatus connection terminal 114. Each test circuit 120 may be provided with a control signal, a power supply, or the like from the control apparatus 10. In addition, at normal times, the first test circuit 120-1 operates, and the other test circuits 120 operate when the first test circuit 120-1 is in failure. The plurality of test circuits 120 may be the same as each other.

Each switch section 118 selects the test circuit 120 currently in operation, form the plurality of test circuits 120. In addition, at normal times, the first switch section 118-1 operates, and the other switch sections 118 operate when the first switch section 118-1 is in failure. The plurality of switch sections 118 may be the same circuit as each other. The switch section 118 connects the selected test circuit 120 to the second intermediate connection terminals 115 via the pad 119, to test the corresponding semiconductor chip 310.

As explained above, the circuit section 110 is formed on the wafer substrate 111 that is a semiconductor, and so can form the test circuit 120 having a semiconductor element with high density. A plurality of test circuits 120 having a preliminary circuit and so on can be easily provided in a region corresponding to the semiconductor chips 310. Note that the circuit section 110 may have such a configuration that includes a single test circuit 120 without any switch section 118.

Figure 10:
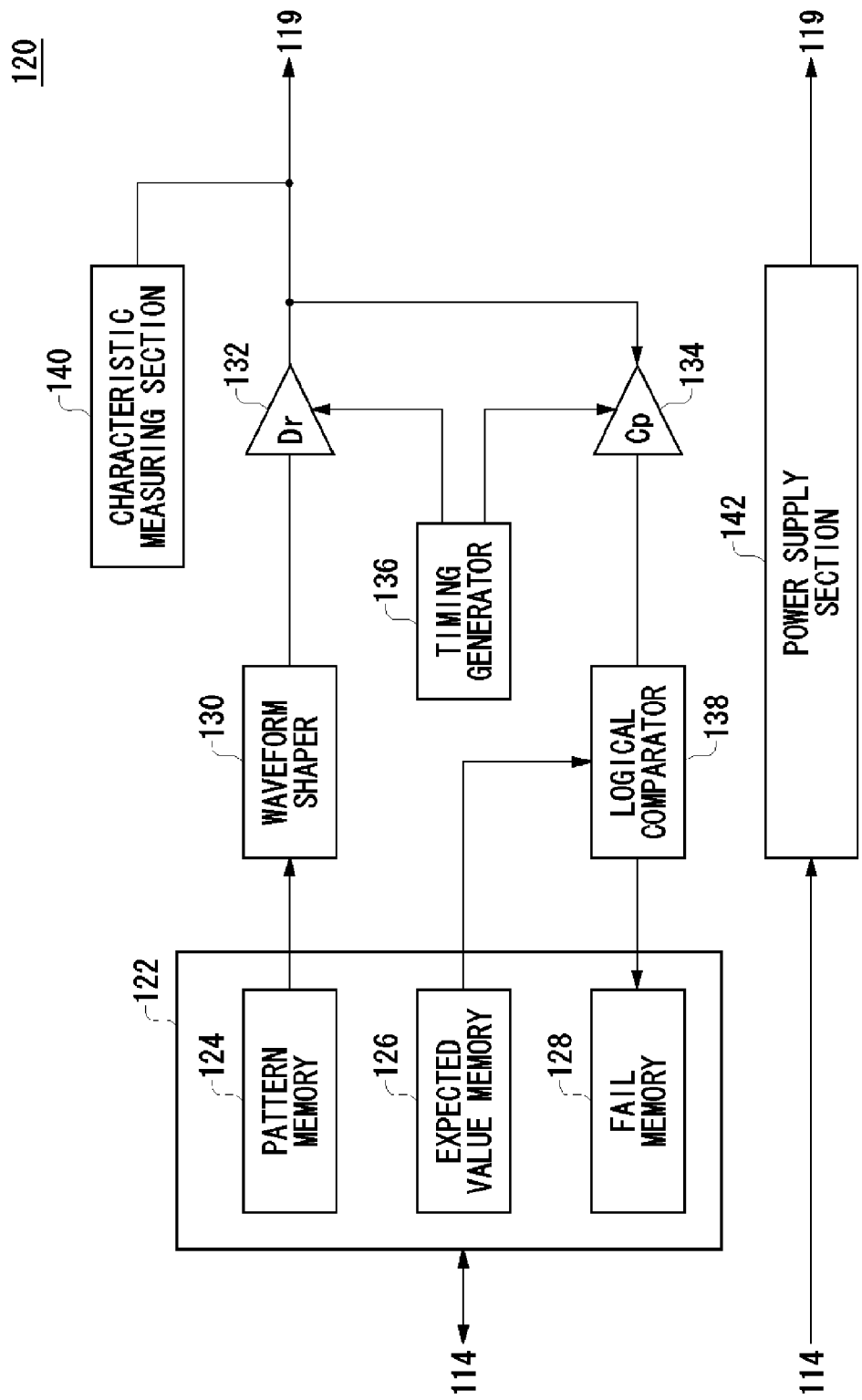
FIG. 10 is a block diagram showing an exemplary functional configuration of a test circuit 120.

FIG. 10 is a block diagram showing an exemplary functional configuration of a test circuit 120. The test circuit 120 includes a pattern generator 122, a waveform shaper 130, a driver 132, a comparator 134, a timing generator 136, a logical comparator 138, a characteristic measuring section 140, and a power supply section 142. The test circuit 120 may have the configuration shown in FIG. 5, for each input/output pin of semiconductor chip 310 connected thereto.

The pattern generator 122 generates a logical pattern of a test signal. The pattern generator 122 of the present example includes a pattern memory 124, an expected value memory 126, and a fail memory 128. The pattern generator 122 may output a logical pattern pre-stored in the pattern memory 124. The pattern memory 124 may store the logical pattern provided from the control apparatus 10 provided prior to the start of a test. In addition, the pattern generator 122 may generate the logical pattern based on an algorithm given in advance.

The waveform shaper 130 may shape the waveform of a test signal based on the logical pattern provided from the pattern generator 122. For example, the waveform shaper 130 may shape the waveform of the test signal by outputting the voltage according to each logical value of the logical pattern for each predetermined bit period.

The driver 132 outputs the test signal according to the waveform provided from the waveform shaper 130. The driver 132 may output the test signal according to the timing signal provided from the timing generator 136. For example, the driver 132 may output the test signal in the same period as that of the timing signal. The test signal outputted from the driver 132 is provided to the corresponding semiconductor chip 310 via the switch section 118 or the like.

The comparator 134 measures the response signal outputted from the semiconductor chip 310. For example, the comparator 134 may measure the logical pattern of the response signal by sequentially detecting the logical value of the response signal according to the strobe signal provided from the timing generator 136.

The logical comparator 138 functions as a judging section for judging the acceptability of the corresponding semiconductor chip 310 based on the logical pattern of the response signal measured by the comparator 134. For example, the logical comparator 138 may judge the acceptability of the semiconductor chip 310 by determining whether the expected value pattern provided from the pattern generator 122 matches the logical pattern detected by the comparator 134. The pattern generator 122 may supply the expected value pattern pre-stored in the expected value memory 126, to the logical comparator 138. The expected value memory 126 may store the logical pattern provided from the control apparatus 10 prior to the start of a test. The pattern generator 122 may also generate the expected value pattern based on an algorithm given in advance.

The fail memory 128 stores the comparison result of the logical comparator 138. For example, when testing the memory region of the semiconductor chip 310, the fail memory 128 may store the acceptability judgment result of the logical comparator 138, for each address of the semiconductor chip 310. The control apparatus 10 may read the acceptability judgment result stored in the fail memory 128.

For example, the apparatus connection terminal 114 may output the acceptability judgment result stored in the fail memory 128, to the control apparatus 10 outside the probe wafer 100-2.

The characteristic measuring section 140 measures the waveform of the voltage or the current outputted from the driver 132. For example, the characteristic measuring section 140 may function as a judging section that judges the acceptability of the semiconductor chip 310 based on judgment on whether the waveform the current or the voltage supplied from the driver 132 to the semiconductor chip 310 satisfies the predetermined specification.

The power supply section 142 supplies power for driving the semiconductor chip 310. For example, the power supply section 142 may provide the semiconductor chip 310 with power corresponding to the power provided from the control apparatus 10 during a test. The power supply section 142 may also provide each constituting element of the test circuit 120 with a driving power.

By providing the test circuit 120 with the stated configuration, the test system 400 whose control apparatus 10 has a reduced size can be realized. For example, the control apparatus 10 may be a general personal computer.

Figure 11:
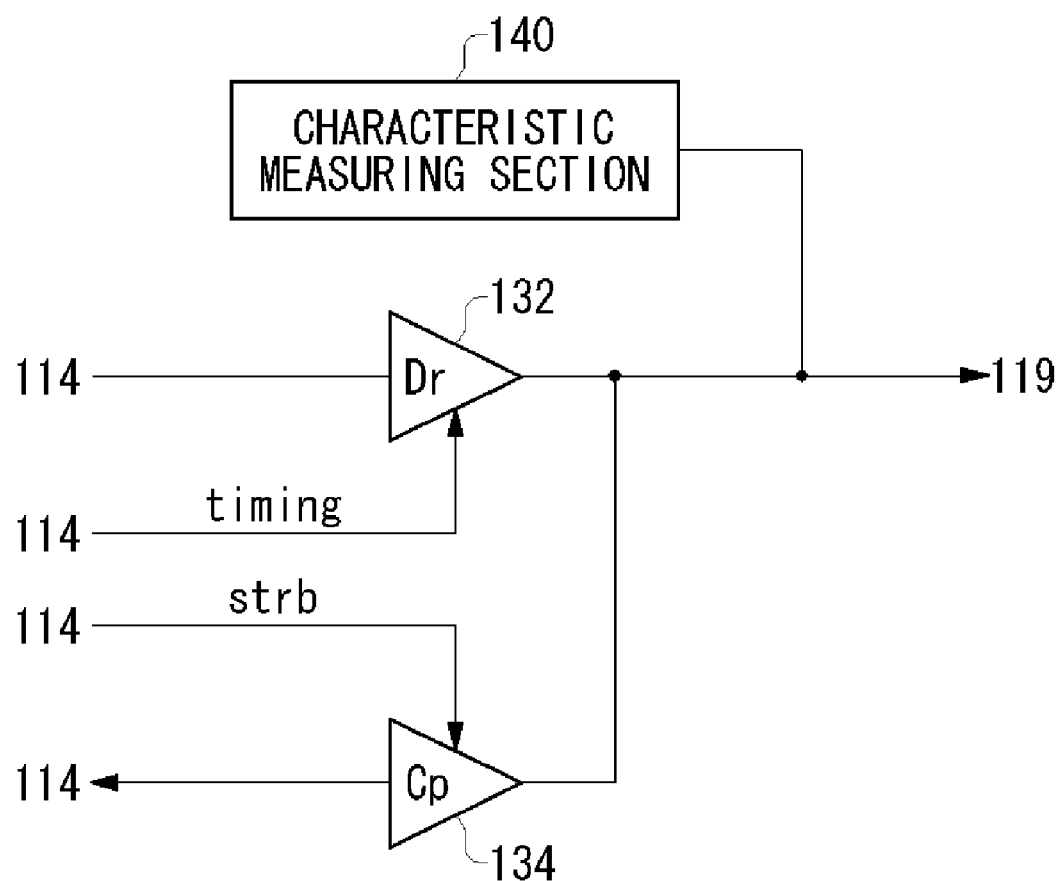
FIG. 11 shows another exemplary configuration of the test circuit 120.

FIG. 11 shows another exemplary configuration of the test circuit 120. The test circuit 120 in the present example includes a part of the configuration of the test circuit 120 explained above with reference to FIG. 10. For example, the test circuit 120 may include a driver 132, a comparator 134, and a characteristic measuring section 140. The driver 132, the comparator 134, and the characteristic measuring section 140 may be the same as the driver 132, the comparator 134, and the characteristic measuring section 140 explained above with reference to FIG. 10.

In this case, the control apparatus 10 may include the pattern generator 122, the waveform shaper 130, the timing generator 136, the logical comparator 138, and the power supply section 142 explained above with reference to FIG. 10. The test circuit 120 outputs a test signal in response to the control signal supplied from the control apparatus 10. In addition, the test circuit 120 transfers, to the control apparatus 10, the measurement result of the comparator 134. The size of the control apparatus 10 can also be reduced according to the configuration of such a test circuit 120.

In addition, the probe wafer 100 may include a single circuit section 110 for each predetermined number of semiconductor chips 310. In this case, each circuit section 110 may test any selected semiconductor chip 310 from among the corresponding plurality of semiconductor chips 310.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A probe apparatus electrically connected to a semiconductor wafer on which a plurality of semiconductor chips are formed, the probe apparatus comprising:
   a probe wafer for pitch conversion that is electrically connected to the semiconductor wafer; and
   a probe wafer for circuit formation that is electrically connected to the probe wafer for pitch conversion, wherein
   the probe wafer for pitch conversion includes:
      a wafer substrate for pitch conversion;
      a plurality of wafer connection terminals formed on a surface of the wafer substrate for pitch conversion that opposes the semiconductor wafer, at least one wafer connection terminal being provided for each one of the semiconductor chips and electrically connected to an input/output terminal of the corresponding semiconductor chip;
      a plurality of first intermediate connection terminals formed on a surface of the wafer substrate for pitch conversion that opposes the probe wafer for circuit formation in one-to-one relation with the plurality of wafer connection terminals at an interval different from an interval of the wafer connection terminals, to be electrically connected to the probe wafer for circuit formation; and
      a plurality of transfer paths, each of which electrically connects a corresponding wafer connection terminal to a first intermediate connection terminal, and
   the probe wafer for circuit formation includes:
      a wafer substrate for circuit formation provided to oppose a surface of the wafer substrate for pitch conversion on which the plurality of intermediate connection terminals are provided;
      a plurality of second intermediate connection terminals provided on the wafer substrate for circuit formation in one-to-one relation with the plurality of first intermediate connection terminals, each second intermediate connection terminal electrically connected to a corresponding one of the first intermediate connection terminals; and
      a plurality of circuit sections provided so that at least one circuit section is provided for each one of the semiconductor chips, generates a signal to the corresponding semiconductor chip, and supplies a signal to the corresponding semiconductor chip via the intermediate connection terminals and the wafer connection terminal.

2. The probe apparatus according to claim 1, further comprising:
   a switch section provided on the wafer substrate for pitch conversion, to switch which of the first intermediate connection terminals each of the wafer connection terminals is connected to.

3. A test system for testing a plurality of semiconductor chips formed on a semiconductor wafer, the test system comprising:
   a signal generating section that outputs a test signal supplied to each of the semiconductor chips;
   the probe apparatus according to claim 1 that supplies the test signal received from the signal generating section, to each of the semiconductor chips; and
   a judging section that receives, via the probe apparatus, a response signal outputted from each of the semiconductor chips in response to the test signal, and judges acceptability of each of the semiconductor chips based on the response signal.

4. The probe apparatus according to claim 1, wherein the probe wafer for circuit formation further includes:
   a plurality of apparatus connection terminals, formed on a surface of the wafer substrate for circuit formation opposite a surface on which the plurality of second intermediate connection terminals are provided, in one-to-one relation with the plurality of second intermediate connection terminals, to be electrically connected to an external apparatus; and
   a second plurality of transfer paths, each of which electrically connects a corresponding second intermediate connection terminal to an apparatus connection terminal.

5. The probe apparatus according to claim 4, wherein at least one of the apparatus connection terminals receives, from the external apparatus, a power to be supplied to the semiconductor chips, and a wafer connection terminal corresponding to the at least one apparatus connection terminal supplies the power to the semiconductor chips.

6. The probe apparatus according to claim 5, wherein each of the transfer paths includes a plurality of through holes provided through the wafer substrate, so as to connect each of the wafer connection terminals to a corresponding one of the first intermediate connection terminals, and a through hole corresponding to a first intermediate connection terminal that receives the power from the at least one apparatus connection terminal is filled with a different conductive material that is different from a conductive material used to fill the other through holes.

7. The probe apparatus according to claim 6, wherein at least one through hole filled with the different conductive material is provided for each one of the semiconductor chips.

8. The probe apparatus according to claim 1, wherein the plurality of first intermediate connection terminals are formed at an interval that is wider than an interval of the wafer connection terminals.

9. The probe apparatus according to claim 1, wherein the wafer substrate for pitch conversion is made of a semiconductor material that is the same as a semiconductor material of the semiconductor wafer.

10. The probe apparatus according to claim 1, wherein the surface of the wafer substrate for pitch conversion on which the wafer connection terminals are formed is formed in a shape that is substantially the same as a shape of a surface of the semiconductor wafer on which the semiconductor chips are formed.

* * * * *